United States Patent [19]

Siao

[11] Patent Number: 5,306,986
[45] Date of Patent: Apr. 26, 1994

[54] ZERO-VOLTAGE COMPLEMENTARY SWITCHING HIGH EFFICIENCY CLASS D AMPLIFIER

[75] Inventor: Roger Siao, Mountain View, Calif.
[73] Assignee: Diablo Research Corporation, Sunnyvale, Calif.
[21] Appl. No.: 887,168
[22] Filed: May 20, 1992
[51] Int. Cl.[5] .................... H05B 41/16; H03F 3/217
[52] U.S. Cl. ..................................... 315/248; 330/251
[58] Field of Search ........................ 330/207 A, 251; 315/248

[56] References Cited

U.S. PATENT DOCUMENTS

| | | |
|---|---|---|
| 3,227,923 | 1/1966 | Marrison . |
| 3,239,772 | 3/1966 | Dennis, Jr. ........................... 330/251 |
| 3,500,118 | 3/1970 | Anderson . |
| 3,521,120 | 7/1970 | Anderson . |
| 3,987,334 | 10/1976 | Anderson . |
| 3,987,335 | 10/1976 | Anderson . |
| 4,010,400 | 3/1977 | Hollister ............................... 315/248 |
| 4,017,764 | 4/1977 | Anderson . |
| 4,024,431 | 5/1977 | Young . |
| 4,048,541 | 9/1977 | Adams et al. . |
| 4,117,378 | 9/1978 | Glascoek, Jr. . |
| 4,119,889 | 10/1978 | Hollister . |
| 4,166,234 | 8/1979 | Tak et al. . |
| 4,171,503 | 10/1979 | Kwon . |
| 4,178,534 | 12/1979 | McNeill et al. . |
| 4,206,387 | 6/1980 | Kramer et al. . |
| 4,240,010 | 12/1980 | Buhrer . |
| 4,245,178 | 1/1981 | Justice . |
| 4,245,179 | 1/1981 | Buhrer . |
| 4,253,047 | 2/1981 | Walker et al. . |
| 4,254,363 | 3/1981 | Walsh . |
| 4,260,931 | 4/1981 | Wesselink et al. . |
| 4,376,912 | 3/1983 | Jernakoff . |
| 4,383,203 | 5/1983 | Stanley ................................. 315/248 |
| 4,390,813 | 6/1983 | Stanley . |
| 4,422,017 | 12/1983 | Denneman et al. . |
| 4,536,675 | 8/1985 | Postma . |
| 4,568,859 | 2/1986 | Houkes et al. . |
| 4,622,495 | 11/1986 | Smeelen . |
| 4,625,152 | 11/1986 | Nakai . |
| 4,631,449 | 12/1986 | Peters, Jr. ......................... 315/248 X |
| 4,645,967 | 2/1987 | Boyman et al. . |
| 4,661,746 | 4/1987 | Postma et al. . |
| 4,675,577 | 6/1987 | Hanlet . |
| 4,704,562 | 11/1987 | Postma et al. . |
| 4,710,678 | 12/1987 | Houkes et al. . |
| 4,727,294 | 2/1988 | Houkes et al. . |
| 4,727,295 | 2/1988 | Postma et al. . |
| 4,728,867 | 3/1988 | Postma et al. . |
| 4,792,727 | 12/1988 | Godyak . |
| 4,797,595 | 1/1989 | De Jong . |
| 4,812,702 | 3/1989 | Anderson . |
| 4,864,194 | 9/1989 | Kobayashi et al. . |
| 4,894,590 | 1/1990 | Witting . |
| 4,922,157 | 5/1990 | Van Engen et al. . |
| 4,927,217 | 5/1990 | Kroes et al. . |
| 4,940,923 | 7/1990 | Kroontje et al. . |
| 4,952,844 | 8/1990 | Gudyak et al. . |
| 4,962,334 | 10/1990 | Godyak . |
| 4,977,354 | 12/1990 | Bergerwet et al. . |
| 4,987,342 | 1/1991 | Gudyak . |
| 5,006,752 | 4/1991 | Eggink et al. . |
| 5,006,763 | 4/1991 | Anderson . |
| 5,013,975 | 5/1991 | Ukegawa et al. . |
| 5,023,566 | 6/1991 | El-Hamamsy et al. ............. 330/251 |
| 5,103,976 | 5/1991 | Butler . |
| 5,218,315 | 6/1993 | Turner ................................. 330/10 |

OTHER PUBLICATIONS

Brochure of the Operating Principles of the Phillips QL Lamp System, "QL Induction Lighting", Phillips Lighting B. V., 1971 (17 pages).
"14-1 Class D Amplification-Idealized Operation", Krauss et al., Solid State Radio Engineering, John Wiley & Sons (1980).
Solid State Radio Engineering, H. Krauss et al., John Wiley & Sons, p. 374, 1980.

Primary Examiner—James B. Mullins
Attorney, Agent, or Firm—Skjerven, Morrill, MacPherson, Franklin & Friel

[57] ABSTRACT

A high-efficiency Class D amplifier is described. In one embodiment, the amplifier contains two transistors which are turned on and off in sequence, the output being taken from the common node between the transistors. The efficiency of the amplifier is substantially increased by insuring that voltage across each of the transistors is substantially zero when it turns on. This advantage is achieved by connecting an inductance to the common node, so that the electrical energy stored in any stray capacitance is transferred to the inductance before any transistor is turned on.

22 Claims, 3 Drawing Sheets

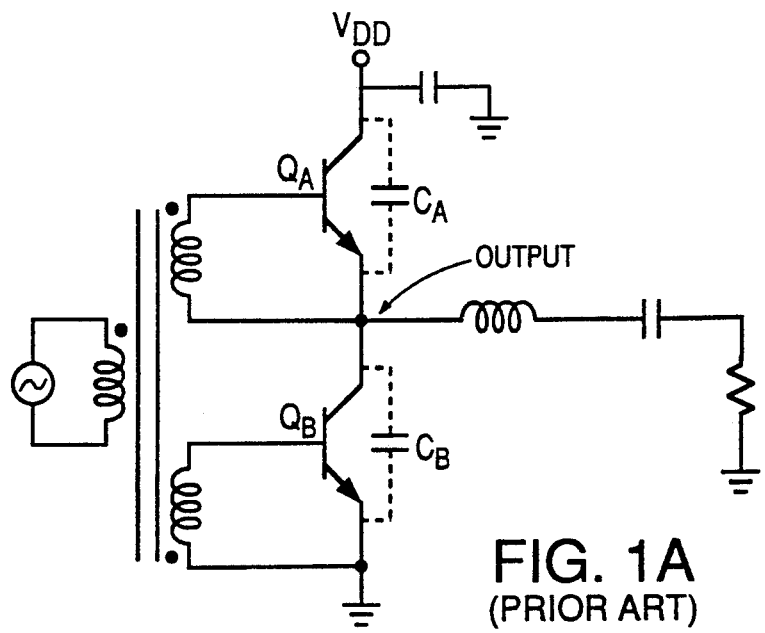
FIG. 1A
(PRIOR ART)
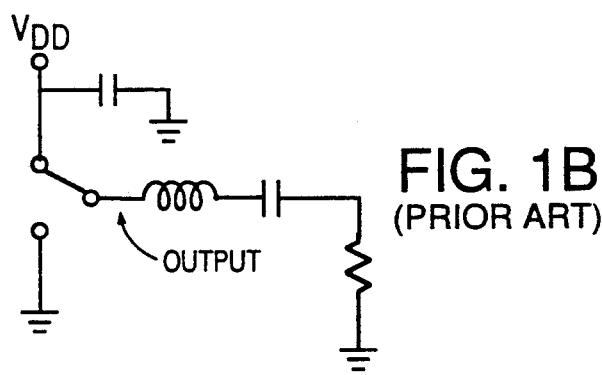
FIG. 1B
(PRIOR ART)
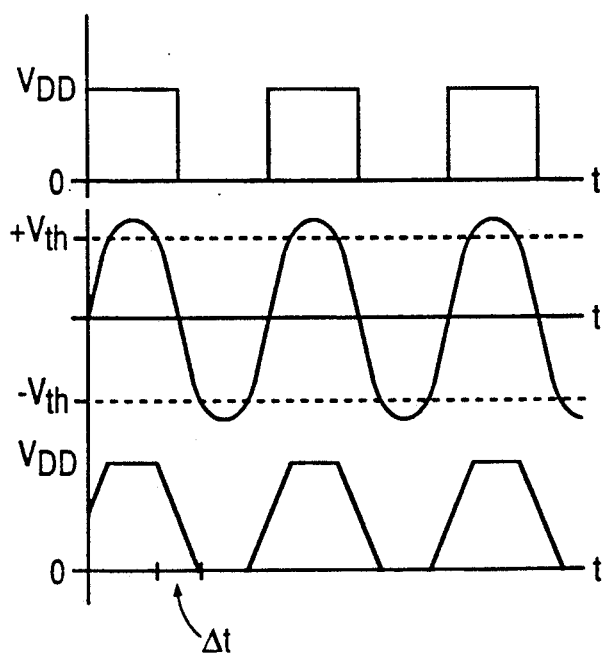
FIG. 1C
FIG. 1D
FIG. 1E

ZERO-VOLTAGE COMPLEMENTARY SWITCHING HIGH EFFICIENCY CLASS D AMPLIFIER

CROSS-REFERENCE TO RELATED APPLICATIONS

This application is related to, and incorporates by reference, the following U.S. patent applications filed on the same date as the present application: the application entitled "Electrodeless Discharge Lamp with Spectral Reflector and High Pass Filter" filed by Nicholas G. Vrionis, Ser. No. 07/887,165 filed May 20, 1992, the application entitled "Radio Frequency Interference Reduction Arrangements for Electrodeless Discharge Lamps" filed by Nicholas G. Vrionis and Roger Siao, Ser. No. 07/883,850 filed May 20, 1992; the application entitled "Phosphor Protection Device for Electrodeless Discharge Lamp" filed by Nicholas G. Vrionis and John F. Waymouth, Ser. No. 07/883,972 filed May 20, 1992; the application entitled "Base Mechanism to Attach an Electrodeless Discharge Light Bulb to a Socket in a Standard Lamp Harp Structure" filed by James W. Pfeiffer and Kenneth L. Blanchard, Ser. No. 07/884,000 filed May 20, 1992, the application entitled "Fluorescent Light Bulbs and Lamps and Methods for Making fluorescent Light Bulbs and Lamps", filed by Nicholas G. Vrionis, Ser. No. 07/883,971 filed May 20, 1992; the application entitled "Stable Power Supply in an Electrically Isolated System Providing a High Power Factor and Low Harmonic Distortion" filed by Roger Siao, Ser. No. 07/886,718 filed May 20, 1992; and the application entitled "Impedance Matching and Filter Network for Use With Electrodeless Discharge Lamp" filed by Roger Siao, Ser. No. 07/887,166 filed May 20, 1992.

FIELD OF THE INVENTION

This invention relates to Class D amplifiers and in particular to high-efficiency Class D amplifiers which are suitable for providing a high-frequency signal to an induction coil in an electrodeless discharge lamp.

BACKGROUND OF THE INVENTION

A basic form of Class D amplifier is illustrated in FIG. 1A. Two transistors $Q_A$ and $Q_B$ are driven by a transformer to switch on and off 180 degrees out of phase with each other. The two transistors in combination are equivalent to the double-pole switch illustrated in FIG. 1B, and at their common node produce a square-wave output similar to the waveform illustrated in FIG. 1C.

Ideally, a Class D amplifier should be 100% efficient, i.e., no power should be consumed in transistors $Q_A$ or $Q_B$ as they are repeatedly switched on and off. In reality, however, transistors $Q_A$ and $Q_B$ have their own on-stage resistances, commonly known as the on-resistance of the transistor. They also have inherent capacitances, illustrated as capacitors $C_A$ and $C_B$ in FIG. 1A, which permit charge to build up when either transistor is turned off. Therefore, a voltage difference exists across the transistor when it is turned on, and the resulting current flow through the transistor dissipates energy as heat. This energy loss can be expressed as $cv^2 f$, where c is the inherent capacitance of the transistor (the value of $C_A$ or $C_B$), v is the DC input voltage ($V_{DD}$) and f is the frequency at which the amplifier is driven. In reality, high frequency Class D amplifiers typically operate at an efficiency of about 50% to 60%. A large portion of this efficiency loss is attributable to the inherent capacitances of the transistors. This inefficiency has seriously limited the suitability of Class D amplifiers for electrodeless discharge lamps and other devices in which significant power losses cannot be tolerated.

In actual operation, transistors $Q_A$ and $Q_B$ having the same electrical characteristic, do not switch off and on instantaneously and simultaneously as implied in FIG. 1C. Rather, the input from the transformer is typically sinusoidal and turns each transistor on when it reaches its threshold voltage $V_{th}$, as indicated in FIG. 1D. Accordingly, there is a lag between the time when one of the transistors turns off and the other transistor turns on. The output signal is therefore not a perfect square wave but instead has sloped transitions as illustrated in FIG. 1E, the time lag being denoted as $\Delta t$. Moreover, a finite time is required to turn each transistor on or off.

SUMMARY OF THE INVENTION

In a Class D amplifier in accordance with this invention, an inductance, internal to the amplifier, is capacitively coupled to the common node between the two transistors. The inductance in effect forms a resonant circuit with the inherent capacitances of the transistors as well as other stray capacitances present in the circuit, all of which are referred to together as the output capacitance $C_O$. The value of the inductance is selected such that, in the interval ($\Delta t$) during which both transistors are turned off, the power stored in the output capacitance $C_O$ is transferred to the inductance. Thus, when one transistor is turned off, an energy transfer takes place between the output capacitance $C_O$ and the inductance such that when the other transistor turns on there is no voltage drop across it. As noted above, this is the condition required to minimize power losses due to the switching of the transistors.

The resonant circuit formed with the inductance and the output capacitance thus causes the energy stored in the output capacitance to be transferred to the inductance rather than being dissipated by a current flow and heat loss when the transistor is turned on.

The principles of this invention are particularly applicable to devices such as electrodeless discharge lamps, where it is important to the overall efficiency of the lamp to minimize the power lost in amplifying the oscillating signal that is delivered to the induction coil.

DESCRIPTION OF THE DRAWINGS

FIG. 1A illustrates a circuit diagram of a conventional Class D amplifier.

FIG. 1B illustrates an equivalent circuit for the Class D amplifier.

FIG. 1C illustrates an idealized output of the Class D output amplifier.

FIG. 1D illustrates the input from the signal source to the Class D amplifier.

FIG. 1E illustrates the output of the Class D amplifier taking into account switching delays.

DESCRIPTION OF THE INVENTION

Figure 2:
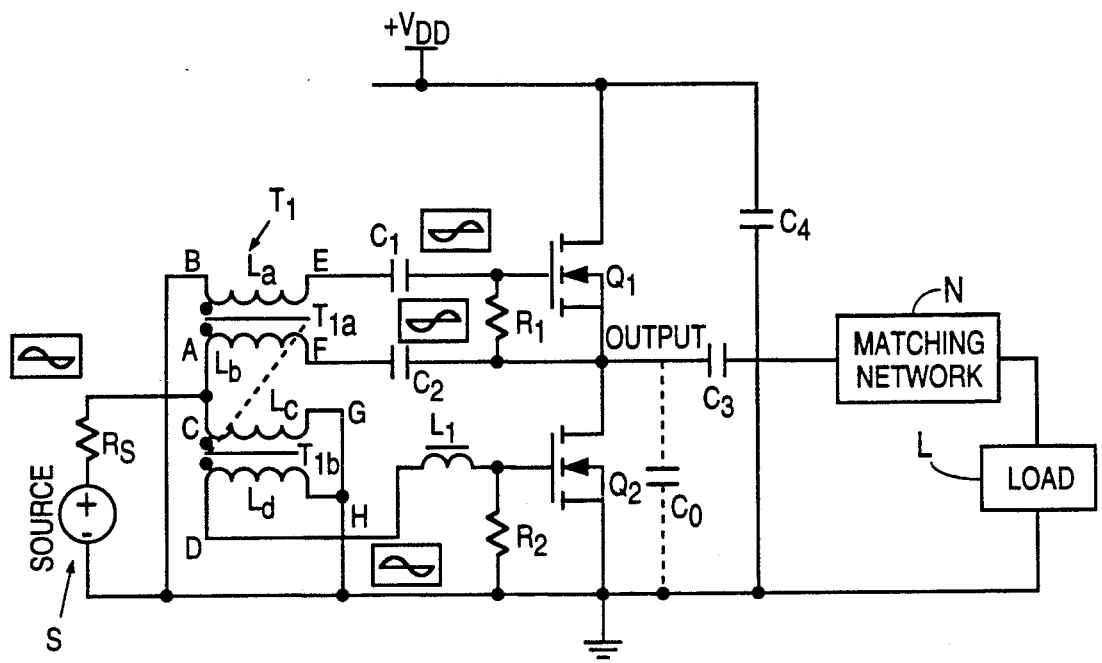
FIG. 2 illustrates a circuit diagram of a Class D amplifier in accordance with the invention.
Figure 3:
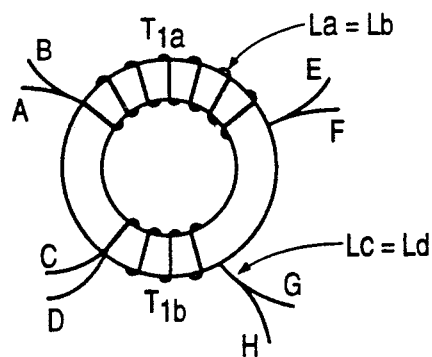
FIG. 3 illustrates the transformer in the Class D amplifier of FIG. 2.

FIG. 2 illustrates a circuit diagram of a high-efficiency Class D amplifier in accordance with this invention. A signal source S delivers a sinusoidal input signal, $R_S$ representing the impedance of signal source S. This input signal is delivered to a transformer assembly $T_1$ which includes transformers $T_{1a}$ and $T_{1b}$ sharing the same core CR, as shown in FIG. 3. The windings of transformers $T_{1a}$ and $T_{1b}$ are identified as $L_a$, $L_b$, $L_c$ and $L_d$ in FIGS. 2 and 3. ($L_a$–$L_d$ sometimes refer to the self-inductance of each individual winding.) As illustrated in FIG. 3, windings $L_a$ and $L_b$ are bifilarly wound around one side of a core CR, and windings $L_c$ and $L_d$ are bifilarly wound around the other side of core CR. The pair of windings $L_a$ and $L_b$ are wound around core CR in the same direction as the windings $L_c$ and $L_d$. The coupling between windings $L_a$ and $L_b$ (transformer $T_{1a}$) and between windings $L_c$ and $L_d$ (transformer $T_{1b}$) is nearly unity, while because transformers $T_{1a}$ and $T_{1b}$ are positioned on opposite sides (approximately 180 degrees apart) of core CR, and because the permeability of core CR is very low, the coupling between them is very low (typically about 0.15). For reasons described below, Transformer $T_{1a}$ has more turns than transformer $T_{1b}$.

The switching function is provided by transistors $Q_1$ and $Q_2$, each of which is an N-channel power MOSFET. Transistors $Q_1$ and $Q_2$ are connected in series between a DC supply voltage $V_{DD}$ and ground, with the source terminal of transistor $Q_1$ and the drain terminal of transistor $Q_2$ forming a common node which represents the output of the amplifier. The output is fed to an impedance matching network N and a load L. Impedance matching network N may be of several varieties known to those skilled in the art and is not a part of this invention.

Winding $L_a$ has an end E which is AC coupled to the gate of transistor $Q_1$ through a coupling capacitor $C_1$. An end F of winding $L_b$ is AC coupled to the output through a coupling capacitor $C_2$, and an end D of winding $L_d$ is connected to the gate terminal of transistor $Q_2$ through an inductance $L_1$. Capacitors $C_1$, $C_2$ and $C_3$ shown in FIG. 2 serve as AC coupling capacitors. Capacitor $C_4$ serves as an AC bypass capacitor which ensures that the AC impedance between the drain terminal of transistor $Q_1$ and current ground is maintained at a minimum. Resistors $R_1$ and $R_2$ are connected between the gate and source terminals of transistors $Q_1$ and $Q_2$, respectively, and ensure that the gates of those transistors are maintained at a DC zero bias.

Transformer $T_{1a}$ forms a Balun transmission-line transformer, which inverts the signal from source S and applies the inverted signal across the gate of transistor $Q_1$. (Balun transformers are described in *Solid State Radio Engineering*, by Herbert L. Krauss, et al., John Wiley & Sons, 1980, p. 374, which is incorporated herein by reference.) On the other hand, transformer $T_{1b}$ is a conventional transformer, which delivers a signal to the gate of transistor $Q_2$ that is in phase with the signal from source S. Thus, when the signal from source S goes high the output of transformer $T_{1b}$ at end D also goes high and turns transistor $Q_2$ on. At the same time, the output from transformer $T_{1a}$ at end E referenced to end F goes low turning transistor $Q_1$ off. The arrangement of the Balun transformer $T_{1a}$ and the regular transformer $T_{1b}$ on core CR in the manner shown helps to ensure that there is adequate separation between the time when one of transistors $Q_1$ and $Q_2$ turns off and the other transistor turns on. In addition, inductance $L_1$ imposes a phase delay in the signal applied to the gate of transistor $Q_2$ and further insures that transistors $Q_1$ and $Q_2$ will both be turned off for some period of time at each transition of the output signal (or to minimize overlapping between transistors $Q_1$ and $Q_2$).

Capacitor $C_O$, shown in hatched lines, represents the total output capacitance of the amplifier. Thus it includes both the inherent capacitances of transistors $Q_1$ and $Q_2$ (comparable to capacitors $C_A$ and $C_B$ in FIG. 1A) as well as any other stray capacitances in the circuit.

Figure 4A:
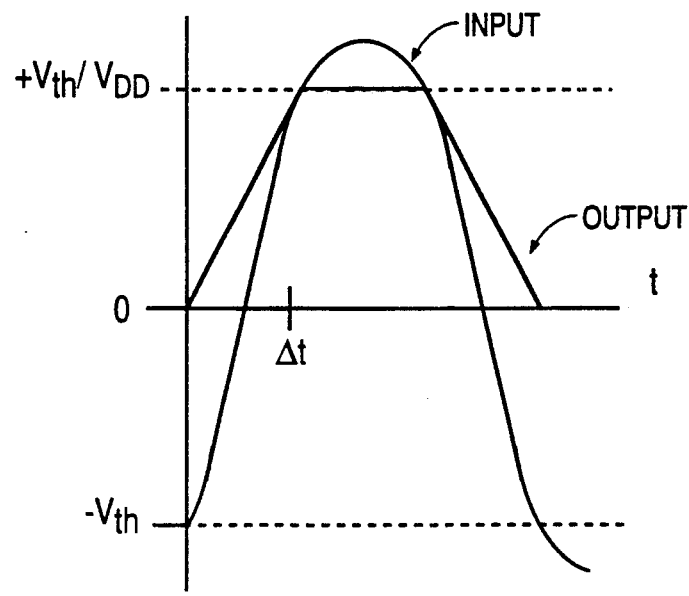
FIG. 4A is a superimposed view of the input and output signals of a Class D amplifier.
Figure 4B:
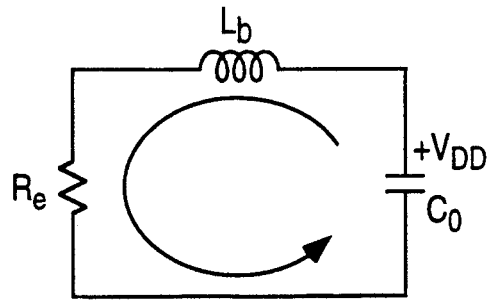
FIG. 4B illustrates the resonant circuit in the Class D amplifier of FIG. 2.

FIG. 4A illustrates a graph of the input signal from source S superimposed upon the output signal, and FIG. 4B illustrates in idealized form a resonant circuit found within the Class D amplifier. FIG. 4A shows in particular the time interval $\Delta t$ during which the input signal is less than the threshold voltage $V_{th}$ of either of transistors $Q_1$ and $Q_2$. As noted above, this represents the time period in which both transistors are turned off. While this is the case, the common node between transistors $Q_1$ and $Q_2$ floats, and a resonant circuit is in effect established. As illustrated in FIG. 4B, this resonant circuit includes capacitor $C_O$, inductor $L_b$ (which is a part of transformer $T_{1a}$) and the equivalent series resistance $R_e$ of the charge-circulating path formed by $L_b$ and $C_O$. For small values of $R_e$, the natural frequency $f_n$ of this circuit is governed by the following relationship:

$$f_n = \frac{1}{2\pi \sqrt{L_b C_o}} \qquad (1)$$

Thus, at the instant both transistors $Q_1$ and $Q_2$ turn off the charge built up on capacitor $C_O$ begins to discharge through the resonant circuit illustrated in FIG. 4B, at a rate determined by the natural frequency of the circuit. The desired condition is that the voltage across each of transistors $Q_1$ and $Q_2$ will be equal to zero when the transistors turn on. The time it takes for the voltage across $C_O$ to fall from $+V_{DD}$ to zero is approximately equal to one-fourth of the length of a single cycle at the natural frequency $F_n$. Thus, if the voltage across $C_O$ is to be zero when transistor $Q_2$ turns on, the following relationship should obtain $$\Delta t = 1/4 f_n \qquad (2)$$

Combining equations (1) and (2) gives the required value of $L_b$.

$$f_n = \frac{1}{2\pi \sqrt{L_b C_o}} = \frac{1}{4\Delta t}$$

or $$L_b = \frac{4\Delta t^2}{\pi^2 C_o}$$

If this relationship is maintained, in the steady state the energy stored in $C_O$ will be transferred to the inductance $L_b$ during the period $\Delta t$ when both transistors are turned off, rather than being dissipated as heat generated by a current flow through one of transistors $Q_1$ or $Q_2$ when it is turned on. The stored energy is transferred back and forth between $C_O$ and $L_b$ (the "flywheel" effect) instead of being dissipated.

In the preferred embodiment, the following relationship should obtain $$L_a = L_b >> L_c = L_d$$

Ideally, the values of $L_a$ or $L_b$ are approximately ten times the values of $L_c$ or $L_d$. This ensures that the energy reflected back from the output of the amplifier to the common input node (A and C) is substantially attenuated. Windings $L_b$ and $L_c$ are equivalent to a voltage divider between the output terminal and circuit ground. As a result, the input driving power supplied by source S is minimized while the amplifier exhibits better stability. Also, giving winding $L_c$ a relatively low value as compared with winding $L_b$ allows the value of $L_c$, as well as the low impedance of source S, to be ignored in calculating the resonant frequency of the circuit, as illustrated in FIG. 4B. Further, the low value of $L_c$ ensures that the impedance at the common node is relatively fixed by the low impedance of winding $L_c$. Windings $L_c$ and $L_d$ should, however, provide sufficient impedance for source 10.

Figure 5:
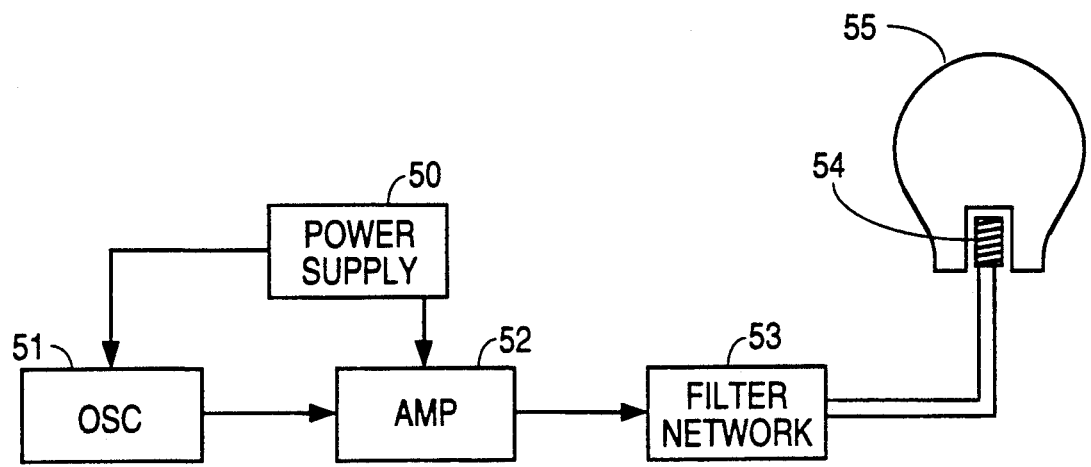
FIG. 5 illustrates a block diagram of a Class D amplifier in accordance with this invention connected to an electrodeless discharge lamp.

The Class D amplifier of this invention is useful with any type of device which requires high-efficiency amplification. It is particularly useful with an electrodeless discharge lamp, as illustrated in FIG. 5. As described in U.S. Pat. No. 4,010,400 to Hollister, incorporated herein by reference, electrodeless discharge lamps typically include an induction coil which is energized at a high frequency so as to transfer energy to a gaseous mixture by means of an electromagnetic field. The gaseous mixture, which typically includes mercury vapor and an inert gas, is contained within a sealed vessel, the inside surfaces of which are coated with phosphors. When so energized, the atoms of mercury vapor are excited and emit radiation (primarily in the UV spectrum), which in turn causes the phosphors to emit visible light.

As shown in FIG. 5, a power supply 50 supplies power to an oscillator 51 and an amplifier 52 in accordance with this invention. The oscillator normally operates at 13.56 MHz, which is a frequency set aside by the FCC for industrial, scientific and medical (ISM) applications. The output of amplifier 52 is passed through a filter and matching network 53 to an induction coil network 54, which is positioned within a central cavity of a glass vessel 55. Network 53 is preferably the impedance matching and filter network described in application Ser. No. 07/887,166 filed May 20, 1992.

To illustrate the benefits of this invention as applied to electrodeless discharge lamps, assuming a DC supply voltage of 130 V and a frequency of 13.56 MHz, the power losses according to the formula $cv^2f$ would typically equal about 9 watts for a total capacitance $C_O=40$ pf. This is about half the rated power consumption of a 19 watt bulb. Using the techniques of this invention, the efficiency of the amplifier can be increased from 50% or 60% to about 95%, and the power loss falls to about 1 watt.

The embodiment described above is intended to be illustrative and not limiting. Numerous alternative embodiments will be apparent to those skilled in the art, and all such alternative embodiments are intended to be within the broad scope of this invention, as defined in the following claims. For example, although the electrodeless discharge lamp described in U.S. Pat. No. 4,010,400 has been referred to, the amplifier of this invention may be used with other types of electrodeless discharge lamps. Moreover, the principles of this invention are applicable to electrodeless discharge lamps in which the visible light is generated directly from the enclosed gas rather than by a coating of phosphors applied to the surface of the enclosing vessel.

I claim:

1. An amplifier comprising:
   first and second switching means connected in series;
   a switch control means for controlling said first and second switching means; and
   a signal source connected to said switch control means, said switch control means operative to cause each of said first switching means and said second switching means to open and close in sequence, one of said first and second switching means being open whenever the other of said first and second switching means is closed, and there being a time interval during which both of said first and second switching means are open;
   wherein said amplifier has an inherent capacitance which stores energy when one of said first and second switching means is open;
   said switch control means comprising a means for storing energy, said means for storing energy being operative during said time interval to receive energy stored in said inherent capacitance so as to reduce the voltage across each of said first and second switching means to approximately zero when it changes from an open to a closed condition.

2. The amplifier of claim 1 wherein said switch control means comprises a transformer having a primary winding and a secondary winding, said means for storing energy comprising said primary winding.

3. The amplifier of claim 2 wherein said first switching means comprises a first transistor and said second switching means comprises a second transistor.

4. The amplifier of claim 2 wherein said transformer comprises a Balun transformer.

5. The amplifier of claim 4 wherein said switch control means further comprises a conventional transformer, said Balun transformer being connected to said first switching means and said conventional transformer being connected to said second switching means.

6. The amplifier of claim 5 wherein said conventional transformer and said Balun transformer each comprise a primary winding and a secondary winding, said primary and secondary windings of both said conventional transformer and said Balun transformer being wound on a toroidal core.

7. The amplifier of claim 6 wherein the primary winding of said Balun transformer has a self inductance $L_b$ which is substantially equal to a self inductance $L_a$ of the secondary winding of said Balun transformer, the primary winding of said conventional transformer has a self inductance $L_c$ which is substantially equal to a self inductance $L_d$ of the secondary winding of said conventional transformer, and each of $L_a$ and $L_b$ is substantially greater than each of $L_c$ and $L_d$.

8. The amplifier of claim 7 wherein the ratio $L_c/L_b$ constitutes an attenuation factor that represents a reduction in a positive feedback signal that is delivered from a common node between said first and second switching means to a common node between the respective primary windings of said Balun and conventional transformers.

9. The amplifier of claim 7 comprising an inductor connected between said conventional transformer and said second switching means.

10. The amplifier of claim 9 wherein said inductor has a value selected so as to impose a phase delay in the signal applied to said second gating means.

11. The amplifier of claim 1 wherein said means for storing energy comprises an inductance having a value substantially equal to $L_b$ such that $$L_b = \frac{4\Delta t^2}{\pi^2 C_o}$$

wherein $\Delta t$ is the length of said time interval in seconds and $C_o$ is the value of said inherent capacitance of said amplifier.

12. An electrodeless discharge lamp comprising:
an amplifier according to claims 1, 2, 3, 4, 11, 5, 6, 7, 8 or 9; and
an induction coil positioned adjacent to a sealed vessel, said sealed vessel containing gas comprising a metal vapor, said amplifier being connected to said induction coil.

13. The electrodeless discharge lamp of claim 12 wherein said induction coil is positioned within a central cavity formed by an exterior surface of said vessel.

14. The electrodeless discharge lamp of claim 12 wherein said sealed vessel is coated with phosphors.

15. The electrodeless discharge lamp of claim 12 wherein visible light is generated by the gas contained in said sealed vessel.

16. The amplifier according to claim 1 wherein the means for storing energy comprises an inductance having a value selected such that substantially all the energy stored in said inherent capacitance is transferred to said inductance during said time interval.

17. An electrodeless discharge lamp comprising:
a source of an oscillating signal;
an induction coil positioned adjacent to a sealed vessel, said sealed vessel containing a metal vapor; and
an amplifier connected to said induction coil, said amplifier comprising:
first and second switching means connected in series; and
a switch control means for sequentially opening and closing said first and second switching means;
wherein said amplifier has an inherent capacitance which stores energy when one of said first and second switching means is open;
said switch control means comprising a means for storing energy, said means for storing energy being operative to receive energy stored in said inherent capacitance so as to reduce the voltage across each of said first and second switching means to substantially zero when each of said first and second switching means changes from an open condition to a closed condition.

18. The electrodeless discharge lamp of claim 17 wherein said induction coil is positioned within a central cavity formed by an exterior surface of said vessel.

19. The electrodeless discharge lamp of claim 18 wherein said means for storing energy comprises an inductance.

20. The electrodeless discharge lamp of claim 19 wherein said first switching means comprises a first transistor and said second switching means comprises a second transistor.

21. The electrodeless discharge lamp of claim 20 wherein said switch control means comprises a Balun transformer, said means for storing energy being at least partially included within said Balun transformer.

22. The electrodeless discharge lamp of claim 21 further comprising a conventional transformer wherein said Balun transformer and said conventional transformer are arranged so as to ensure that said first and second switching means are open during a time interval.

* * * * *